United States Patent [19]

Seko et al.

[11] Patent Number: 4,845,012

[45] Date of Patent: Jul. 4, 1989

[54] PHOTOCURABLE ELECTRODEPOSITION COATING COMPOSITIONS FOR PRINTED CIRCUIT PHOTORESIST FILMS

[75] Inventors: Kenji Seko, Yokosuka; Toshio Kondo, Fujisawa, both of Japan

[73] Assignee: Kansai Paint Co., Ltd., Hyogo, Japan

[21] Appl. No.: 46,190

[22] Filed: May 5, 1987

[30] Foreign Application Priority Data

May 9, 1986 [JP] Japan .................... 61-106416

[51] Int. Cl.$^4$ .................... G03C 1/68; G03C 1/94
[52] U.S. Cl. .................... 430/287; 430/277; 430/327; 430/286; 430/280; 522/85; 522/86; 204/180.6; 204/181.6
[58] Field of Search .................... 204/180.6, 181.6; 522/85, 86; 430/280, 286, 327, 277, 287

[56] References Cited

U.S. PATENT DOCUMENTS

| | | | |
|---|---|---|---|
| 3,497,356 | 2/1970 | Martinson | 430/287 X |
| 3,954,587 | 5/1976 | Kokawa | 204/181.6 |
| 4,040,925 | 8/1977 | McGinniss | 525/922 X |

OTHER PUBLICATIONS

Sullivan, Mary Rose, "Electrode Reactions in Electrodeposition of Paint", *Journal of Paint Technology*, vol. 38, No. 499, Aug. 1966, pp. 424–428.

*Primary Examiner*—Paul R. Michl
*Assistant Examiner*—Cynthia Hamilton
*Attorney, Agent, or Firm*—Wenderoth, Lind & Ponack

[57] ABSTRACT

A photocurable electrodeposition coating composition for printed circuit photoresist film comprising (a) a water-soluble or water-dispersible polymerizable unsaturated resin having an acid value of 20 to 300, an unsaturation equivalent of 150 to 3,000 and a number-average molecular weight of not less than 300, (b) a water-insoluble photopolymerization initiator, and (c) a chelating agent.

9 Claims, No Drawings

PHOTOCURABLE ELECTRODEPOSITION COATING COMPOSITIONS FOR PRINTED CIRCUIT PHOTORESIST FILMS

This invention relates to a photocurable electrodeposition coating composition for printed circuit photoresist film, and more specifically to a photocurable electrodeposition coating composition for printed circuit photoresist film which makes it possible to easily develop (remove) an unexposed portion of an electrodeposition coated film exposed through a negative or positive film, and which can form an excellent printed circuit pattern.

Printed circuit boards have been hitherto formed by a method which comprises laminating a photosensitive film on a copper-clad laminate, further laminating a negative film thereon, conducting exposure and development, then subjecting the unnecessary copper foil except the printed circuit pattern to an etching treatment, and removing the photosensitive film coated on the copper foil forming the printed circuit. A printed circuit board can thereby be obtained wherein the printed circuit is formed on the laminate being an insulator.

As the photosensitive film employed in the above method is in general a relatively great thickness of about 50 microns, a circuit pattern formed by exposure and development is not sharp, the photosensitive film is hardly laminated uniformly on the copper foil surface, and the photosensitive film is almost wastefully removed in the developing step in spite of its high cost. An advent of technical means to replace the photosensitive film has been long demanded.

This invention has been made on the basis of an idea that a photocurable electrodeposition coating composition is utilized in place of the above conventional photosensitive film for eliminating the above problems associated with the use of the photosensitive film in forming the printed circuit board. This invention is to provide a photocurable electrodeposition coating composition that has been developed in particular for use in a printed circuit photoresist film, said composition being able to form a uniform coated film easily developable and having an excellent ultraviolet curability on at least one surface of the copper-clad laminate.

Some photocurable electrodeposition coatings have been hitherto proposed (e.g. U.S. Pat. Nos. 3,954,587 and 4,592,816). If the conventional coatings are however used as such to form printed circuit photoresist films, copper is ionized from the copper-clad laminate at the point of electrodeposition coating and eluted into a coated film or a coating bath, with a consequence that the copper ion is reacted with an acid group of the resin to form a copper complex to cause false crosslinking. Accordingly, the unexposed portion given after laminating a photographic film on the photosensitive coated film electrodeposited on the copper-clad laminate and subjecting the resulting laminate to exposure cannot be developed with a weak alkali, making it impossible to obtain a circuit pattern.

The present inventors have made extensive studies to obtain a photocurable electrodeposition coating composition suited for forming a printed circuit photoresist film and free from the aforesaid problems, and as a result found that the problems can be resolved by adding a chelating agent to a photocurable electrodeposition coating composition. This finding has led to completion of this invention.

This invention is thus to provide a photocurable electrodeposition coating composition for printed circuit photoresist film comprising (a) a water-soluble or water-dispersible polymerizable resin (hereinafter simply referred to as a "polymerizable unsaturated resin") having an acid value of 20 to 300, preferably 40 to 110, more preferably 50 to 90, an unsaturation equivalent of 150 to 3,000, preferably 250 to 1,000, and more preferably 300 to 700, and a numberaverage molecular weight of not less than 300, preferably 1,000 to 30,000, more preferably 3,000 to 20,000, (b) a water-insoluble photopolymerization initiator, and (c) a chelating agent.

The polymerizable unsaturated resin (a) used in this invention is a resin containing at least one radicalpolymerizable unsaturated bond in a polymer main chain or side chain, and the same resin as used in the conventional photocurable electrodeposition coating is available as this resin. To be concrete, said resin can be selected from the group of the followin resins (1)-(5).

(1) A polymerizable unsaturated resin obtained by adding an equimolar addition product of a hydroxyl group-containing compound and a diisocyanate compound to a hydroxyl group-containing acrylic resin having a high acid value:

Examples of the hydroxyl group-containing compound include hydroxyalkyl (meth)acrylates such as 2-hydroxyethyl acrylate, 2-hydroxyethyl methacrylate and 2-hydroxypropyl acrylate, N-methylolacrylamide, N-methylolmethacrylamide, allyl alcohol and methallyl alcohol. Examples of the diisocyanate compound to be added to the hydroxyl group-containing compound include tolylene diisocyanate, xylene diisocyanate, hexamethylene diisocyanate and lysine diisocyanate.

The hydroxyl group-containing acrylic resin having the high acid value can be produced by copolymerizing the aforesaid hydroxyl group-containing unsaturated compound and an unsaturated carboxylic acid as an acid value-imparting component optionally with one or more (meth)acrylic acid alkyl ($C_{1-18}$) esters in the same usual manner as in the production of acrylic resins. Examples of the unsaturated carboxylic acid include acrylic acid and methacrylic acid. Examples of the (meth)acrylic acid alkyl ($C_{1-18}$) esters include methyl acrylate, ethyl acrylate, ethyl methacrylate, n-propyl acrylate, isopropyl methacrylate and n-butyl acrylate. An urethanization reaction between the hydroxyl group-containing unsaturated compound and the diisocyanate compound and an urethanization addition reaction between the reaction product of these compounds and the hydroxyl group-containing acrylic resin having the high acid value can be carried out in usual manners. The polymerizable unsaturated resin can optionally contain an ethylenically unsaturated compound having one or more polymerizable unsaturated bonds in one molecule. Examples of the ethylenically unsaturated compound include known compounds, e.g. (meth)acylic acid alkyl ($C_{1-18}$) esters such as methyl (meth)acrylate, ethyl (meth)acrylate, butyl (meth)acrylate and octyl (meth)acrylate; vinyl aromatic compounds such as styrene, vinyltoluene and vinylbenzene; and oligomers such as diethylene glycol di(meth)acrylate, polyethylene glycol di(meth)acrylate, 1,4-butanediol di(meth)acrylate and pentaerythritol tri(meth)acrylate.

(2) A mixture of a polymerizable unsaturated resin obtained by adding an α,β-ethylenically unsaturated dibasic acid or its anhydride to an unsaturated bond of an aliphatic acid chain in an ester of an epoxy resin and an unsaturated aliphatic acid, and an ethylenically unsaturated compound:

The epoxy resin is a compound having a relatively high molecular weight and containing at least one epoxy group in one molecule. Examples thereof include bisphenol diglycidyl ether, ethylene glycol diglycidyl ether, polyethylene glycol diglycidyl ether, propylene glycol diglycidyl ether, polypropylene glycol diglycidyl ether, glycerol polyglycidyl ether, trimethylolpropane polyglycidyl ether, pentaerythritol polyglycidyl ether and cresol novolak polyglycidyl ether. Examples of the unsaturated aliphatic acid to be reacted with the epoxy resin include oleic acid, linolic acid, linolenic acid, eleostearic acid, licanic acid, ricinoleic acid and arachidonic acid.

On the other hand, Examples of the α,β-ethylenically unsaturated dibasic acid or its anhydride include maleic acid, maleic anhydride, fumaric acid and itaconic acid. The acid value of the polymerizable unsaturated resin formed from the aforesaid components can be adjusted by the amount of the αβ-ethylenically unsaturated dibasic acid or its anhydride, and the unsaturation equivalent by the type and the amount of the unsaturated aliphatic acid, respectively.

The ethylenically unsaturated compound to be mixed with the polymerizable unsatruated resin can be the same as indicated in (1) above. A suitable mixing ratio of the polymerizable unsaturated resin/the ethylenically unsaturated compound is generally ⅓ to 3/1, preperably ½ to 2/1 in terms of an unsaturation equivalent ratio.

(3) A mixture of a polymerizable unsaturated resin composed of an unsaturated aliphatic acid modified alkyd resin having a high acid value and an ethylenically unsaturated compound:

The polymerizable unsaturated resin is an unsaturated aliphatic acid modified alkyd resin having a high acid value and obtained by an esterification reaction between an unsaturated aliphatic acid and a hydroxyl group contained in the skeleton of an ester (an alkyd resin) comprising a mixture of a dibasic acid having two carboxyl groups in one molecule and a polybasic acid having three or more carboxyl groups in one molecule and a polyhydric alcohol having two or more hydroxyl groups in one molecule. A molar ratio of the acid component used in producing said ester to the alcohol component is preferably 0.8 to 1.0.

The acid value of the alkyd resin obtained in this reaction can be adjusted by the type and the amount of the starting polybasic acid, and the unsaturation equivalent by the amount of the unsaturated aliphatic acid. In case of the unsaturated aliphatic acid modified alkyd resin wherein the amount of the hydroxyl group is larger than that of the carboxyl group, the acid value may be imparted by half esterifying the dibasic acid.

Examples of the dibasic acid used to produce the alkyd resin are phthalic anhydride, isophthalic acid, terephthalic acid, tetrahydrophthalic anhydride, maleic anhydride, fumaric acid succinic acid and sebacic acid. Examples of the polybasic acid include trimellitic acid, pyromellitic acid and pyromellitic anhydride. Examples of the polyhydric alcohols include ethylene glycol, propylene glycol, butylene glycol, neopentyl glycol, glycerol, trimethylolethane, trimethylolpropane, pentaerythritol, sorbitol and diglycerol. The unsaturated aliphatic acid used to modify the alkyd resin which is produced from these acid and alcohol components can be the same as the unsaturated aliphatic acid to be reacted with the epoxy resin in producing said polymerizable unsaturated resin (2).

(4) A mixture of a polymerizable unsaturated resin composed of a maleinized oil and an ethylenically unsaturated compound:

The maleinized oil is a reaction product of an unsaturated oil having a conjugated double bond or a non-conjugated double bond and maleic anhydride. One or more of vinyl monomers such as styrene, vinyltoluene, cyclopentadiene, acrylate esters and methacrylate esters can be further added optionally to the reaction product, making it possible to improve a curability of a coated film. In the polymerizable unsaturated resin containing the above maleinized oil, the acid value can be adjusted by the amount of maleic anhydride, and the unsaturation equivalent by the unsaturated bond contained in the oil respectively. Examples of the unsaturated oil include oils having generally an iodine value of 80 to 150, such as linseed oil, tung oil, soybean oil, castor oil, coconut oil, sardine oil, cottonseed oil and hempseed oil.

(5) A polymerizable unsaturated resin obtained by adding a glycidyl group-containing unsaturated compound to an acrylic resin having a high acid value:

The acrylic resin having the high acid value include resins yielded by copolymerizing α,β-ethylenically unsaturated acids as an essential component with unsaturated monomers and having an acid value of generally 40 to 650, preferably 60 to 500. Examples of the α,β-ethylenically unsaturated acids are acrylic acid and methacrylic acid. Examples of the unsaturated monomers are (meth)acrylate esters [e.g. alkyl (meth)acrylates such as methyl (meth)acrylate, ethyl (meth)acrylate, propyl (meth)acrylate, butyl (meth)acrylate and 2-ethylhexyl (meth)acrylate, hydroxyalkyl (meth)acrylates such as hydroxyethyl (meth)acrylate], styrene, (meth)acrylonitrile and (meth)acrylamide.

Meanwhile, examples of the glycidyl group-containing unsaturated compound to be added to the acrylic resin having the high acid value include glycidyl acrylate, glycidyl methacrylate and arylglycidyl ether. The amount of the glycidyl group-containing unsaturated compound is generally 20 to 100 parts by weight, preferably 30 to 80 parts by weight per 100 parts by weight of the acrylic resin having the high acid value.

The addition reaciton of the acrylic resin having the high acid value and the glycidyl group-containing unsaturated compound can easily be performed under the reaction conditions known per se such that for example, a catalyst of tetraethylammonium bromide is used, a temperature is 80° to 120° C. and a reaction time is 1 to 5 hours.

Of these polymerizable unsaturated resins, the resin (5) is preferable because it is excellent in both photosensitivity and electrodeposition property (fine finish).

It is advantageous that the foregoing polymerizable unsaturated resin has a glass transition temperature ($T_g$) of 0° to 100° C., preferably 20° to 70° C. in addition to said acid value, unsaturation equivalent and number-average molecular weight.

Where Tg of the polymerizable unsaturated resin is less than 0° C., the electrodeposition coated film is tacky, and dust or rubbish tends to adhere to the coated film or the coated film is hard to treat. Meanwhile, where $T_g$ exceeds 100° C., the electrodeposition coated film becomes hard and causes crack.

This polymerizable unsaturated resin can be used in combination with such ethylenically unsaturate compound as illustrated in (1) if required.

The amount of the ethylenically unsaturated compound used as an essential component or an optional component in the polymerizable unsaturated resins (1)–(5) is not strictly limited but can vary with its type or the type of the polymerizable unsaturated resin. It is usually not more than 100 parts by weight, preferably 1 to 50 parts by weight per 100 parts by weight of the polymerizable unsaturated resin.

The photocurable electrodeposition coating composition in this invention can contain an ordinary resin binder such as a polymerizable unsaturated groupcontaining resin other than the aforesaid polymerizable unsaturated resin or a saturated resin. Examples of the polymerizable unsaturated group-containing resin include those obtained by introducing ethylenically unsaturated groups into resins, such as a polyester acrylate resin, a polyurethane resin, an epoxy resin and an acrylic resin. Examples of the saturated resins include a polyester resin, a polyurethane resin, an epoxy resin and an acrylic resin. In case of using the other resin binder than the polymerizable unsaturated resin, it is blended in an amount of not more than 100 parts by weight, preferably 1 to 50 parts by weight per 100 parts by weight of the polymerizable unsaturated resin so as to properly adjust properties of the coated film.

The polymerizable unsaturated resin in this invention is water-dispersible or water-soluble, and the water dispersion or water solubilization is carried out by neutralizing the carboxyl group contained in the skeleton of the polymerizable unsaturated resin with an alkali (neutralizing agent). Examples of the neutralizing agent include alkanolamines such as monoethanolamine, diethanolamine and triethanolamine; alkylamines such as triethylamine, diethylamine, monoethylamine, diisopropylamine, trimethylamine and diisobutylamine; alkylalkanolamines such as dimethylaminoethanol; alicyclic amines such as cyclohexylamine; alkali metal hydroxides such as sodium hydroxide and potassium hydroxide; and ammonia. These may be used either singly or as a mixture of two or more. The amount of the neutralizing agent is preferably 0.4 to 1.0 equivalent per mol of the carboxyl group contained in the skeleton of the resin. Where the amount is less than 0.4 equivalent, a water dispersibility decreases and this makes hard the electrodeposition. Where the amount is more than 1.0 equivalent, a storage stability tends to decrease.

The polymerizable unsaturated resin watersolubilized or water-dispersed by neutralization may optionally contain a hydrophilic solvent to improve a flowability of the resin component. Examples of the hydrophilic solvent include alcohols such as isopropanol, n-butranol, t-butanol, methoxyethanol, ethoxyethanol, butoxyethanol and diethylene glycol; and ethers such as methyl ether, dioxane and tetrahydrofuran. When the hydrophilic solvent is used, the amount thereof is generally not more than 300 parts by weight, preferably 1 to 100 parts by weight per 100 parts by weight of the resin component.

Moreover, in order to increase the amount of the coating on the material to be coated, a hydrophobic solvent can optionally be added also to the watersolubilized or water-dispersed polymerizable unsaturated resin. Examples of the hydrophobic solvent include petroleum solvents such as toluene and xylene; ketones such as methyl ethyl ketone and methyl isobutyl ketone; esters such as ethyl acetate and butyl acetate; and higher alcohols such as 2-ethylhexyl alcohol. The amount of the hydrophobic solvent is generally not more than 200 parts by weight, preferably 1 to 100 parts by weight per 100 parts by weight of the resin component.

The water-insoluble photopolymerization initiator used in the composition of this invention can be a water-insoluble photopolymerization initiator commonly used in this sort of the photocurable resin composition. Examples thereof are benzoin, benzoin methyl ether, benzoin ethyl ether, benzyl, diphenyl disulfide, tetramethylthiuram monosulfide, diacetyl, Eosine, Thionine, Michler's ketone, anthraquinone, chloroanthraquinone, methylanthraquinone, α-hydroxyisobutylphenone, p-isopropyl-α-hydroxyisobutylphenone, α,α'-dichloro-4-phenoxyacetophenone, 1-hydroxy-1-cyclohexylacetophenone, 2,2-dimethoxy-2-phenylacetophenone, methylbenzoyl formate, 2-methyl-1-[4-(methylthio)-phenyl]-2-morpholinopropene, thioxanthone and benzophenone. Of these, benzoin ethyl ether, α-hydroxyisobutylphenone, 1-hydroxy-1-cyclohexylacetophenone, 2,2-dimethoxy-2-phenylacetophenone, methylbenzoyl formate, 2-methyl-1-(4-(methylthio)phenyl]-2-morpholinopropene and thioxanthone are especially preferable from the aspects of a storage stability and a photosensitivity. The amount of the water-insoluble photopolymerization initiator varies depending on its type or a desirous curing rate. It is generally 0.1 to 10 parts by weight, preferably 2 to 8 parts by weight per 100 parts by weight of the polymerizable unsaturated resin component.

The "chelating agent" used in the composition of this invention is a chelating agent wherein an oxygen atom (0) acts as a donor atom. Examples of such chelating agent include β-diketones such as acetylacetone and benzoylacetone, acetoacetate esters such as methyl acetoacetate and ethyl acetoacetate, malonate esters such as methyl malonate and ethyl malonate, ketones having a hydroxyl group in the β-position, such as diacetone alcohol, aldehydes having a hydroxyl group in the β-position, such as salicylaldehyde, esters having a hydroxyl group in the β-position, such as methyl salicylate and ethyl salicylate. Of these, the β-diketones and the acetoacetate esters are preferable. The amount of the chelating agent is not critical and can vary with its type or the type of the resin. It is generally 1 to 300 parts by weight, preferably 1 to 150 parts by weight, and most preferably 3 to 50 parts by weight per 100 parts by weight of the polymerizable unsaturated resin component.

The composition of this invention can be produced by adding the above amounts of the respective components to the water-solubilized or water-dispersed polymerizable unsaturated resin formed as above and thoroughly mixing them.

The electrodeposition applied to the printed circuit substrate using the photocurable electrodeposition coating composition in this invention is carried out in the following manner. Namely, an electrodeposition coating bath containing as main components the polymerizable unsaturated resin water-solubilized or water-dispersed by neutralization as above, the water-insoluble photopolymerization initiator and the chelating agent is controlled such that pH is 6.5 to 9, a bath concentration (as a solids content) is usually 3 to 25 % by weight, preferably 5 to 15 % by weight, and a bath temperature is 15° to 40° C., preferably 15° to 30° C. A copper-clad insulation substrate is dipped as an anode in the electrodeposition coating bath thus controlled, and a D.C. electric current of 40 to 400 V is passed. On this occasion, a suitable time of passing the electric current is 30 seconds to 5 minutes, and a thickness of the resulting film is 5 to 100 microns, preferably 20 to 60 microns as a dry film.

After the electrodeposition coating, the coated product is drawn up from the electrodeposition coating bath and washed with water, followed by removing a moisture contained in the electrodeposition coated film through heating means such as a hot air, etc.

Subsequently, a pattern mask is applied to the uncured photocurable electrodeposition coated film formed on the substrate, exposure with actinic rays is carried out, and an unexposed portion except a portion of a conductor circuit is removed by developing treatment.

The actinic rays employed in the exposure of this invention vary depending on an absorption of the photopolymerization initiator, but rays containing actinic rays having a wavelength of 3,000 to 4,500 Å are usually desirable. Examples of a light source generating such rays are a sunlight, a mercury lamp, a xenone lamp and an arc lamp. The curing of the film by irradiation with actinic rays is conducted within a few minutes, usually in 1 second to 20 minutes.

The developing treatment of the exposed substrate is commonly carried out by spraying a weakly alkaline aqueous solution on the surface of the coated film to wash the uncured portion of the coated film. Examples of the weakly alkaline aqueous solution are usually those which can provide a water-solubility by neutralization with a free carboxylic acid contained in the coated film, such as a sodium hydroxide aqueous solution, a sodium carbonate aqueous solution, a potassium hydroxide aqueous solution and an aqueous ammonia. In case of e.g. a sodium carbonate aqueous solution, the suitable amount thereof is about 0.1 to 5%.

The copper foil portion (non-circuit portion) exposed to the substrate by the developing treatment is then removed by a usual etching treatment with ferric chloride. Thereafter, the photocured coated film on the circuit pattern is also dissolved in a strongly alkaline aqueous solution such as a conc. sodium hydroxide aqueous solution and removed to form a print circuit on the substrate.

The photocurable electrodeposition coating composition in this invention can be easily subjected to anion electrodeposition coating on the copper foil, and the coated film deposited is heated and dried to form a uniform photosensitive film. The photosensitive film contains copper ions eluted by the electrodeposition coating. However, the chelating agent in the photosensitive film is reacted faster than the acid group in the resin to form a complex of the chelating agent and copper. Accordingly, after the exposure is conducted by laminating the photographic film, the unexposed portion can easily be washed with a weakly alkaline solution to obtain a clean circuit pattern.

The following Examples illustrate this invention in more detail.

EXAMPLE 1

A mixture comprising 40 parts by weight of methyl methacrylate, 40 parts by weight of butyl acrylate, 20 parts by weight of acrylic acid and 2 parts by weight of azobisisobutylonitrile was added dropwise to 90 parts by weight of propylene glycol monomethyl ether (hydrophilic solvent) held at 110° C. under an atmosphere of a nitrogen gas over the course of 3 hours. After the addition, the mixture was aged for 1 hour. A mixture comprising 1 part by weight of azobisdimethylvaleronitrile and 10 parts by weight of propylene glycol monomethyl ether was added dropwise over the source of 1 hour, and further aged for 5 hours to obtain an acrylic resin having a high acid value of 155. To the solution were then added 24 parts by weight of glycidyl methacrylate, 0.12 part by weight of hydroquinone and 0.6 part by weight of tetraethylammonium bromide. While air was blown in, the reaction was performed at 110° C. for 5 hours to obtain a solution of a polymerizable unsaturated resin (acid value about 50, unsaturation equivalent about 740, and number-average molecular weight 20,000). After the polymerizable unsaturated resin was neutralized with 0.6 equivalent of triethylamine, 6 parts by weight of acetylacetone and 6 parts by weight of α-hydroxyisobutylphenone as a photopolymerization initiator were added, and water was then added such that the solids content became 10% by weight. There resulted an electrode-position coating bath (pH 7.0).

EXAMPLE 2

To 225 parts by weight of the polymerizable unsaturated resin composition obtained in Example 1 was added 10 parts by weight of trimethylolpropane triacrylate, and the mixture was neutralized with 0.6 equivalent of triethylamine. Subsequently, 7 parts by weight of acetylacetone and 7 parts by weight of α-hydroxyisobutylphenone as a photopolymerization initiator were added. Water was then added such that the solids content reached 10% by weight. There resulted an electrodeposition coating bath.

EXAMPLE 3

A mixture comprising 40 parts by weight of methyl methacrylate, 25 parts by weight of butyl acrylate, 15 parts by weight of 2-hydroxyethyl methacrylate, 20 parts by weight of acrylic acid and 2 parts by weight of azobisisobutylonitrile was added dropwise to 100 parts by weight of dioxane (hydrophilic solvent) held at 105° C. under an atmosphere of a nitrogen gas over the course of 2 hours, and the mixture was further aged at the same temperature for 1 hour to obtain a solution of an acylic resin having a high acid value of 155. Thereafter, to 200 parts by weight of the solution was added 20 parts by weight of an equimolar addition product of hydroxyethyl methacrylate and tolylene diisocyanate, and the reaction was performed at a temperature of 80° C. for 5 hours under an atmosphere of a nitrogen gas to afford a solution of a polymerizable unsaturated resin (acid value about 120, unsaturation equivalent about 1,800, and number-average molecular weight about 20,000) usable in this invention. After the polymerizable unsaturated resin was neutralized with 0.6 equivalent of dimethylaminoethanol, 10 parts by weight of methyl acetoacetate and 6 parts by weight of benzoin ethyl ether as a photopolymerization initiator were added, and water was then added such that the solids content reached 10 parts by weight. There resulted an electrodeposition coating bath (pH 7.2).

COMPARATIVE EXAMPLE 1

The procedure in Example 1 was followed except that 20 parts by weight of methyl isobutyl ketone was used instead of acetylacetone. There was obtained an electrodeposition coating bath.

COMPARATIVE EXAMPLE 2

The procedure in Example 3 was followed except that 20 parts by weight of isobutanol was used instead of methyl acetoacetate. There was obtained an electrodeposition coating bath.

The copper-clad laminate was subjected to the electrodeposition coating under the following conditions using each of the electrodeposition coating baths obtained in Examples and Comparative Examples.

| | |
|---|---|
| Bath temperature: | 25° C. |
| Voltage: | D.C. current of 120 V |
| Distance between electrodes: | 10 cm |
| Electrode/laminate ratio: | ½ |
| Time of passing electric current: | 3 minutes |

After the electrodeposition coating, the resulting product was dried at 60° C. for 10 minutes to obtain a 20-micron-thick coated film.

Subsequently, the surface of the coated film was irradiated at a dose of 150 mJ/cm$^2$ through a 200-micron thick negative film using a vacuum printer of a 3 kW ultra-high pressure mercury lamp. After the irradiation, the unexposed portion was washed out with a 1 % sodium carbonate solution. This experiment was continuously conducted for 50 coated laminates on each of the coatings. The copper foil on the developable coated laminate was etched with ferric chloride, and the coated film on the exposed portion was removed with a 5 % sodium hydroxide solution to afford a printed circuit board.

The results of the test on the developed state shown after washing and developing the unexposed portion are indicated in Table 1.

TABLE 1

Developed state shown when an unexposed portion each of the following coated laminates was washed out with a 1% sodium carbonate solution and developed

| Sample | 1st | 5th | 10th | 20th | 30th | 40th | 50th |
|---|---|---|---|---|---|---|---|
| Ex. 1 | O | O | O | O | O | O | O |
| Ex. 2 | O | O | O | O | O | O | O |
| Ex. 3 | O | O | O | O | O | O | O |
| Cex. 1 | Δ | X | X | X | X | X | X |
| Cex. 2 | O | O | O | X | X | X | X |

Ex.: Example
Cex.: Comparative Example
O: Developable
Δ: The unexposed portion is almost developable but the coated film of part of the unexposed portion cannot be washed out.
X: As the eluted copper is crosslinked with the resin of the coated film, the unexposed portion cannot be washed out, and development is impossible.

What we claim is:

1. A photocurable electrodeposition coating composition for a printed circuit photoresist film comprising
   (a) a water-soluble or water-dispersible polymerizable unsaturated resin formed by adding a glycidyl group-containing unsaturated compound to an acrylic resin with a high acid value, and having an acid value of 20 to 300, an unsaturation equivalent of 150 to 3,000 and a number-average molecular weight of not less than 300 and a glass transition temperature of 0° to 100° C.,
   (b) a water-soluble photopolymerization initiator, and
   (c) a chelating agent.

2. The photocurable electrodeposition coating composition of claim 1 wherein the polymerizable unsaturated resin is a resin formed by adding a glycidyl group-containing unsaturated compound to an acrylic resin with a high acid value of 40 to 650, and having an acid value of 40 to 100, an unsaturation equivalent of 250 to 1,000, a number-average molecular weight of 1,000 to 30,000 and a glass transition temperature of 20° to 70° C.

3. The photocurable electrodeposition coating composition of claim 1 wherein the water-insoluble photo polymerization initiator is selected from benzoin ethyl ether, α-hydroxyisobutylphenone, 1-hydroxy-1-cyclohexylacetophenone, 2,2-dimethoxy-2-phenylacetophenone, methylbenzoyl formate, 2-methyl-1-[4-(methylthio)phenyl]-2morpholinopropene and thioxanthone.

4. The electrodeposition coating composition of claim 1 wherein the water-insoluble photopolymerization initiator is contained in an amount of 0.1 to 10 parts by weight per 100 by weight of the polymerizable unsaturated resin.

5. The electrodeposition coating composition of claim 1 wherein the chelating agent is selected from β-diketones, acetoacetate esters, malonate esters, and ketones, esters and aldehydes having a hydroxyl group in the β-position.

6. The electrodeposition coating composition of claim 1 wherein the chelating agent is β-diketones or acetoacetate esters.

7. The electrodeposition coating composition of claim 1 wherein the chelating agent (c) is acetylacetone, methyl acetoacetate or ethyl acetoacetate.

8. The electrodeposition coating composition of claim 1 wherein the chelating agent is contained in an amount of 1 to 300 parts by weight per 100 parts by weight of the polymerizable unsaturated resin.

9. The electrodeposition coating bath composed of the electrodeposition coating composition in claim 1.

* * * * *